United States Patent
Craig et al.

(10) Patent No.: US 7,080,444 B1
(45) Date of Patent: Jul. 25, 2006

(54) APPARATUS FOR FORMING AN ELECTRONIC ASSEMBLY

(75) Inventors: Gordon S. W. Craig, Palo Alto, CA (US); Ming X. Chan, Milpitas, CA (US); Cornelius V. Sutu, Pittsburg, CA (US); Omar R. Alvarado, Santa Clara, CA (US); Hoang Pham, Milpitas, CA (US); Mark Alfred Hadley, Newark, CA (US)

(73) Assignee: Alien Technology Corporation, Morgan Hill, CA (US)

( * ) Notice: Subject to any disclaimer, the term of this patent is extended or adjusted under 35 U.S.C. 154(b) by 503 days.

(21) Appl. No.: 10/086,491

(22) Filed: Feb. 28, 2002

(51) Int. Cl.
*H05K 3/30* (2006.01)
(52) U.S. Cl. .................. 29/740; 29/741; 29/743; 29/759; 29/DIG. 46; 29/834
(58) Field of Classification Search .......... 29/739–743, 29/832–834, 854–855; 156/356, 538, 578; 257/E21.503; 118/313–315; 414/798
See application file for complete search history.

(56) References Cited

U.S. PATENT DOCUMENTS

| 4,386,464 | A | * | 6/1983 | Yanai et al. ................. 29/834 |
| 4,542,397 | A |   | 9/1985 | Biegelsen et al. |
| 5,355,577 | A |   | 10/1994 | Cohn |
| 5,545,291 | A |   | 8/1996 | Smith et al. |
| 5,824,186 | A |   | 10/1998 | Smith et al. |
| 5,904,545 | A |   | 5/1999 | Smith et al. |
| 6,007,631 | A | * | 12/1999 | Prentice et al. ............ 118/669 |
| 6,206,066 | B1 | * | 3/2001 | Imanishi et al. ............ 156/356 |
| 6,331,225 | B1 | * | 12/2001 | Sugiyama .................. 156/299 |
| 6,697,694 | B1 | * | 2/2004 | Mogensen .................. 700/119 |

* cited by examiner

*Primary Examiner*—Minh Trinh
(74) *Attorney, Agent, or Firm*—Blakely, Sokoloff, Taylor & Zafman LLP

(57) ABSTRACT

An apparatus for dispensing blocks in a fluid over a substrate. The apparatus includes a first tube having a first end and a second end. A compression device is coupled to the first tube. A second tube is connected to the first tube to deliver a slurry having blocks to the first tube. The compression device pulsates at least one block in the slurry which is flowing through a portion of the first tube.

12 Claims, 16 Drawing Sheets

APPARATUS FOR FORMING AN ELECTRONIC ASSEMBLY

BACKGROUND

1. Field of the Invention

The present invention relates generally to a method and an apparatus for distributing particles. More specifically, the invention relates to a method and an apparatus for directing the movement of particles such as blocks to efficiently form electronic assemblies.

2. Background

The manufacture of electronic assemblies such as display panels is known in the art. One such method involves using fluidic self-assembly (FSA) that is described in U.S. Pat. No. 5,545,291. In FSA, blocks with integrated circuits thereon are placed into a fluid such as water. The combination of blocks in a fluid, referred to as a slurry, is dispensed over recessed regions in a substrate. The recessed regions receive the plurality of blocks and the blocks are subsequently electrically coupled. Although FSA has provided advantages to electronic device manufacturers such as increased speed of assembling an electronic device, for economic reasons it is necessary to dispense an excess amount of blocks, and recover those blocks that fall to the surface of the substrate without settling into recessed regions. Additionally, because FSA is a stochastic process, initially, some of the recessed regions may not be filled by a block. This is problematic because devices manufactured with some recessed regions that lack a block generally operate less efficiently compared to devices in which all of the blocks have been properly placed. A manufacturer may solve this problem by using a variety of methods. For example, the FSA process may be used a second time over the empty recessed regions. Another method involves using a robot to place a block into a particular recessed region. Typically the robot may not place more than one block into one of the recessed regions. Using the robot is a time consuming and expensive process.

There are other challenges inherent in the FSA process. For example, the slurry must be transported from one process chamber to the next. However, typical fluid control components, such as valves, cannot be used because these components could potentially crush a block, thereby polluting the process chamber with particulate matters. The movement of blocks also cannot be controlled near the recessed regions of the substrate to either direct a block to move into a particular recessed region or to move excess blocks away from recessed regions that are already filled. It is therefore desirable to have a method and an apparatus that address these problems associated with conventional systems.

BRIEF DESCRIPTION OF THE DRAWINGS

The present invention is illustrated by way of example and not limitation in the figures of the accompanying drawings, in which like references indicate similar elements, and in which.

DETAILED DESCRIPTION

Figure 1:
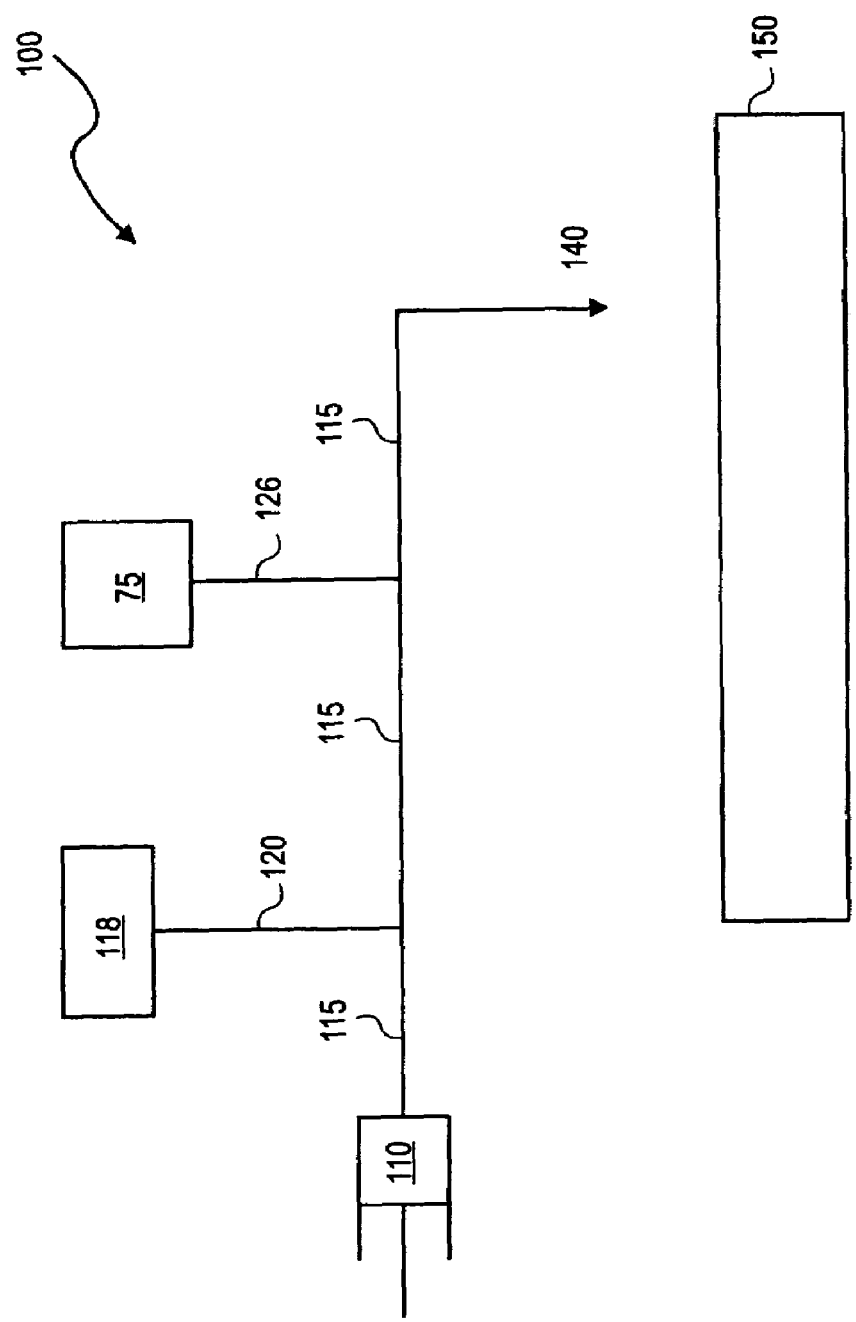
FIG. 1 illustrates a schematic diagram in which blocks, added to a fluid to form a slurry, are dispensed over a substrate in accordance with one embodiment of the invention.

In the following description, numerous specific details such as specific materials, processing parameters, processing steps, etc., are set forth in order to provide a thorough understanding of the invention. One skilled in the art will recognize that these details need not be specifically adhered in order to practice the claimed invention. In other instances, well known processing steps, materials, etc., are not set forth in order not to obscure the invention.

One embodiment of the invention relates to forming an electronic assembly by placing a plurality of blocks into a fluid to create a slurry and moving the slurry in a pulsating motion created by a compressing device coupled to a tube in which the slurry flows. In one embodiment, the pulsating motion of the blocks in the slurry creates a disrupting flow that causes the blocks to be more evenly distributed in the tube by preventing the blocks from settling to the bottom of the tube. The flow also substantially prevents the blocks from dropping or staying in one position on the surface of a substrate that is without recessed regions.

In another embodiment, a dispensing tube having a plurality of nozzles is used to deposit the blocks on the substrate. The dispensing tube is rotatable so as to turn on and off the dispensing of the blocks.

In yet another embodiment, excess blocks are moved by a device that creates a pulsating motion or jet stream flow near the blocks to clear the blocks in a certain area. In one embodiment, this pulsating motion or jet stream flow is created by continuously changing the flow rate. In another embodiment, a vacuum with at least one nozzle is used to remove excess blocks above and around a substrate that are not deposited into recessed regions. In yet another embodiment, a pair of nozzles each carrying a different level of vacuum is used to remove excess blocks wherein a lower vacuum nozzle is used to remove excess blocks near the recessed regions that are already filled with blocks and a higher vacuum nozzle is used to remove excess blocks further away from the recessed regions. The recovered blocks may be sent to a temporary storage area until the blocks can be cleaned and redispensed.

In another embodiment, the blocks are moved from one process chamber to another process chamber by selectively changing the pressure applied to the slurry that flows through a tube connected to the process chambers. Moving the blocks in the slurry from one point to another is accomplished without using mechanical devices such as valves that are known to damage the blocks. By placing the blocks in the proper process chamber, the blocks may be cleaned or treated.

The embodiment below discusses in detail apparatuses and methods depositing blocks into recessed regions in a substrate. It is to be understood that the recessed regions can be replaced with receptor sites. The receptor sites or the recessed regions can be created into the substrate using techniques such as stamping, embossing, injection molding, and casting, among others. Having receptor sites being recessed is common but is not a limitation of the present invention. When the substrate is an organic material and is an amorphous or semicrystalline polymer, the receptor sites may be embossed into the polymer material with a mold that matches the block size and pitch for the device being produced (e.g., an active matrix LCD). Alternatively the receptor sites can be molded or carved into a surface, or, be designed as a raised area of the substrate. Thus, the receptor sites can be recesses, bosses, protrusions, bulges, or protuberances. The receptor sites need not be recessed regions in the substrate.

FIG. 1 illustrates a schematic diagram of blocks 75 which are added to a fluid such as deionized water or other suitable fluid to form a slurry. As mentioned above, the slurry is a combination of the blocks 75 and the fluid. The slurry that is then dispensed over substrate 150 that has recessed regions (not shown) created in the surface of the substrate 150 such that the blocks 75 move in a pulsating motion to increase proper placement of the blocks in recessed regions in the substrate 150 in accordance with one embodiment of the invention.

FIG. 1 also shows an exemplary apparatus used for dispensing the blocks 75 of the present invention, dispensing device 100. The dispensing device 100 includes compression device 110, fluid source 118, the blocks 75, and tubes or pipes (15, 120, and 126). The compression device 110 is configured to rapidly pulsate or agitate the blocks 75 and the fluid flowing from the fluid source 118. When the fluid is dispensed from the fluid source 118 to combine with the blocks 75 in the tube 115, the rapid agitation and pulsation caused by the compression device 110 causes the slurry to pulsate. The slurry is pulsated in a forward and backward motion that ranges from about 0.50 to 0.005 seconds. A flow rate of about 0.25 cc/minute, at 5 to 500 milliseconds of pulsation cycle time, is preferred. The pulsating motion created by the compression device 110 controls the speed of the fluid in the tube 115 and in turn affects the speed of the slurry that is formed in the tube 115. In one example, the slurry has a flow rate ranging from about 50 mL/min to about 500 mL/min.

Rapid agitation or pulsating of the fluid creates turbulent flow of the slurry and the blocks 75 in the tube 115. By creating turbulent flow, the blocks 75 are distributed over the substrate 150 in a more controllable manner compared to more conventional laminar flow of the blocks 75 in a fluid in a tube.

Also as illustrated in FIG. 1, additional fluid from the fluid source 118 (e.g., deionized water) may be added through the tube 120 that combines with the fluid in the tube 115. The blocks 75 are then added to this fluid through tube 126 forming a slurry in the tube 115. The slurry is then dispensed at outlet 140 over the substrate 150 that has recessed regions (not shown) in the surface of the substrate 150 that are configured to receive the blocks 75. For example, if the blocks 75 are square shaped, the recessed regions are designed to be square shaped and slightly larger than the blocks 75 to allow the blocks to closely fit within the recessed regions.

Figure 2:
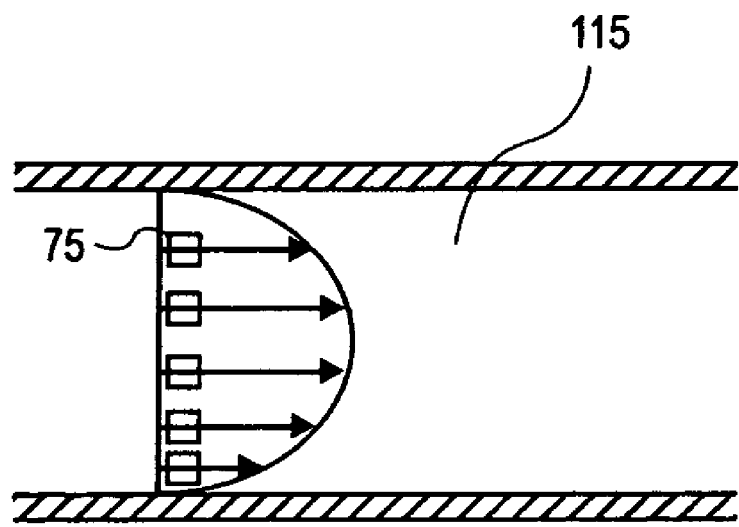
FIG. 2 illustrates a cross-sectional view of a tube with blocks flowing through the tube in accordance with one embodiment of the invention.

FIG. 2 illustrates a cross-sectional view of a generally uniform velocity profile of the blocks 75 in a turbulent flow created by the compression device 110 of the dispensing device 100. The rapid agitation or pulsating of the slurry in the tube 115 caused by the compression device 110 in the tube 115 breaks the static friction that may exist between the blocks 75 and the tube 115 allowing the blocks 75 to move through the tube 115 providing a generally uniform movement of the blocks 75 in the tube 115. In particular, the blocks 75 in a turbulent flow typically do not settle on the bottom of the tube 115 in contrast as to laminar flow that may allow blocks to settle to the bottom of the tube 115. Having the blocks 75 setting at the bottom of the tube 115 or at a portion of the tube 115 is undesirable because that prevents efficient distribution of the blocks 75 along the tube 115 to ultimately dispense the blocks 75 over the substrate 150.

Figure 3:
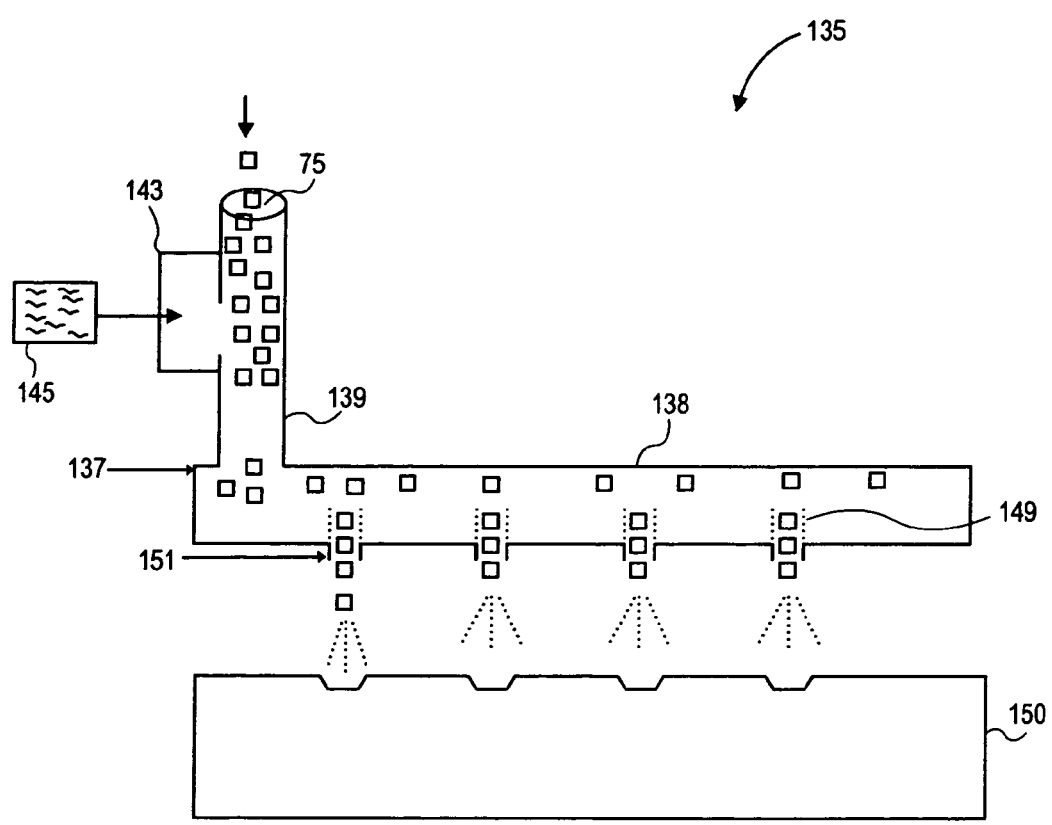
FIG. 3 illustrates an enlarged view of a block dispensing device, used to distribute blocks over a substrate, that is connected to a container of fluid in accordance with one embodiment of the invention.
Figure 4:
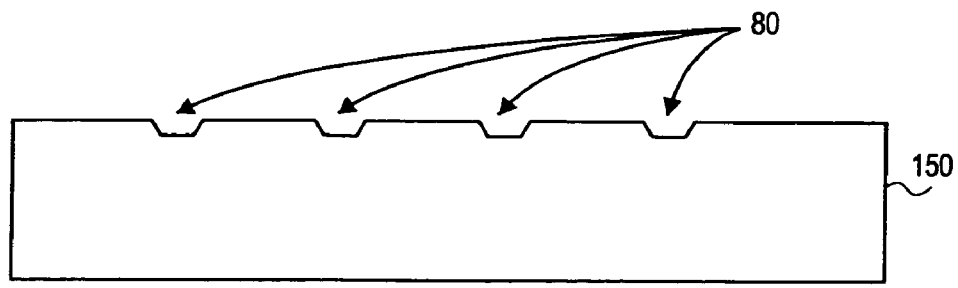
FIG. 4 illustrates a cross-sectional view of a substrate with recessed regions in accordance with one embodiment of the invention.
Figure 5:
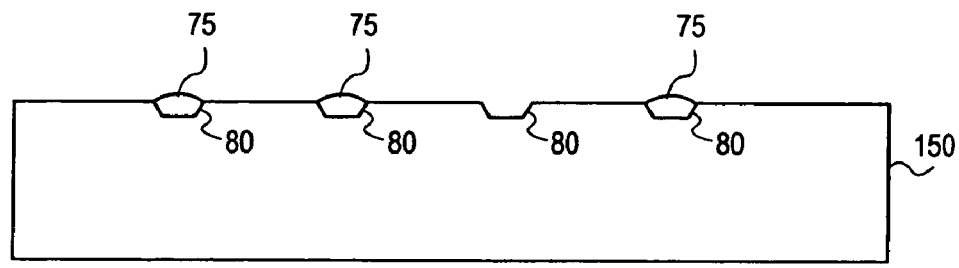
FIG. 5 illustrates a cross-sectional view of the substrate of FIG. 4 with blocks filling recessed regions in the substrate in accordance with one embodiment of the invention.
Figure 6:
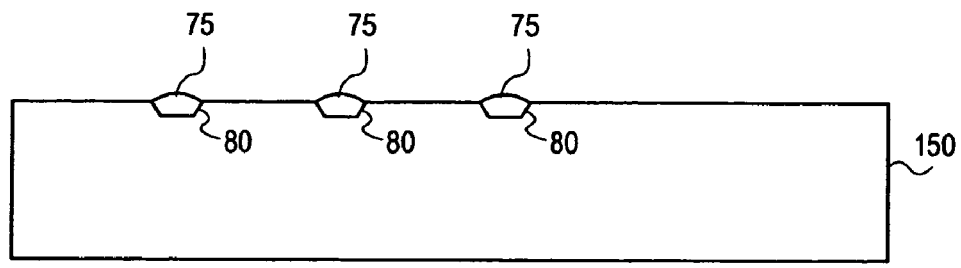
FIG. 6 illustrates a cross-sectional view of the substrate of FIG. 5 in which all of the recessed regions have been filled in accordance with one embodiment of the invention.

FIG. 3 illustrates another exemplary dispensing device made in accordance with the present invention, dispensing device 135. The dispensing device 135 is used to distribute blocks 75 over a substrate 150. The dispensing device 135 comprises a fluid container 145 which is coupled to a pulsating device 143 which is coupled to a distribution line 139. The distribution line 139 extends from a container (not shown) where the blocks 75 are being stored. The fluid container 145 holds a fluid such as deionized water that is pumped by a pump (not shown) to a pulsating device 143 such as a diaphragm pump, a piezo actuator, or a bellows and piston combination. The pulsating device 143 alternately compresses and decompresses the fluid from fluid container 145 thereby creating a pulsation to the flow of the fluid that is being pumped into the distribution line 139 from the fluid container 145. The blocks 75 are released into the distribution line and there they are joined with the fluid to form a slurry. In one example, for the slurry having the blocks 75 is dispensed at a rate ranging from 1 block/sec to 10000 blocks/sec. The flow of the slurry is pulsated by the pulsating device 143. The pulsating action may cause a slight and negligible change in pressure to the flow of the slurry. This slight variation in pressure may be compared to a change in pressure when agitation is applied to a sieve that is commonly used to filter elements well practiced in the art. In the slurry form, the blocks 75 are dispensed into the distribution lines 139.

The distribution line 139 terminates into a block distribution point 137. The distribution line 139 is further coupled to a dispensing tube 138 having a plurality of nozzles 151. As the slurry is passed through the distribution point 137, the slurry comprising the blocks 75 may be divided into, for example, four sectors 149 aligning with the plurality of nozzle 151. The rapid agitation or pulsation caused by the pulsating device 143 continues in the dispensing tube 138.

The rapid agitation or pulsation of the slurry inside the dispensing tube 138 created turbulent flow to the slurry which causes the slurry to be distributed over the sectors 149 evenly. The blocks 75 are then dispensed over a substrate 150. The agitation and pulsation of the slurry enables the slurry to be dispensed over the substrate 150 is a more controlled and evenly fashion.

FIGS. 4 through 6 illustrate a cross-sectional view of the blocks 75 being assembled into the substrate 150 in accordance with one embodiment of the invention. FIG. 4 illustrates a cross-sectional view of recessed regions 80 in the substrate 150. The recessed regions 80 are configured to receive blocks such as a trapezoidal-shaped blocks that may be comprised of material such as silicon crystal. It will be appreciated that other shaped the blocks 75 may have other shapes such as spherical, cylindrical, or other suitable shapes. It will be appreciated also that the substrate 150 may comprise a combination of different shaped recessed regions 80 depending on application. In such event the slurry may comprise a combination of different shaped blocks 75. FIG. 5 illustrates a cross-sectional view of the substrate 150 of FIG. 4 in which the blocks 75 are placed in the recessed regions 80 of the substrate 150. There may be at least one recessed region 80 that is left unfilled during a conventional FSA process. FIG. 6 illustrates a cross-sectional view of the substrate 150 of FIG. 5 in which the blocks 75 have filled all of the recessed regions 80 of the substrate 150 after the slurry flows in a pulsating manner over the substrate 150. Without causing the slurry to move in a pulsating motion in tube 115, recessed region 80 may not have been filled in a single conventional FSA process. The pulsating motion of the blocks 75 that creates the turbulent flow causes the blocks to continue to move until the blocks 75 settle into the recessed regions.

FIG. 7A illustrates yet another exemplary dispensing device 700 made in accordance with the present invention. The dispensing device 700 can be a new feature integrated into a conventional fluid self-assembly system. Alternatively, the dispensing device 700 can be coupled to the dispensing system 100 discussed above. The dispensing device 700 comprises a dispensing tube 708 having a plurality of dispensing orifices 718 located longitudinally along a surface of the dispensing tube 708, and a vibration source 704 coupling to the dispensing tube 708. The dispensing device 700 further includes an inlet tube 701 through which the slurry is being dispensed. In one example, the dispensing tube 708 can be the tube 140 of the system 100. In this example, the blocks 75 can be combined with the fluid source 118 in the tube 115, and then be dispensed into the inlet tube 702 to get to the dispense tube 708. The blocks 75 are dispensed on to a substrate 726 through the dispensing orifices 718.

The dispensing device 700 enables uniform dispensing of the blocks 75 through the dispensing tube 708 which enhances the efficiency of deposition of the blocks 75 over the substrate 726. Evenly dispensed blocks 75 makes the dispensing of the blocks 75 through the dispensing orifices much more smoothly. The vibration source 704 coupling to the dispensing tube 708 can vibrate, pulsate, or agitate the slurry inside the dispense tube 708; the vibration source 704 thus facilitates evenly dispensing and leveling of the blocks 75 across the plurality of the dispensing orifices 718. The vibration source 704 also prevents the orifices 708 from being plugged with the blocks 75. Furthermore, for appropriate sized orifices, the vibration source 704 can also control whether or not blocks are dispensed at all. For example, when the vibration source 704 is turned off, no blocks 75 will be dispensed. And, when the vibration source 704 is turned on, the blocks 75 will begin to be dispensed. An example of a suitable vibration source 704 is such as a diaphragm pump, a piezo actuator, or a bellows and piston combination. The vibration source 704 produces a range of frequencies that can be varied depending on the desired results, the required uniformity of dispensing, flow requirement and the size and shape of the blocks 75. In one example, the vibration source is set to produce a frequency ranging from 2 Hz to 2000 Hz.

In another example, the plurality of the orifices 718 is sized according with the size and shape of the blocks 75 that are being dispensed. Not all of the orifices 718 in the dispensing tube 708 need to have the same shape and size. One orifice may have a shape and size different from another orifice. The difference in size and shape of the orifices 718 in one dispensing tube 708 enables blocks 75 having different shapes and size to be deposited on the substrate 726. For example if the blocks 75 are square shaped, the orifices can be designed to have square shapes and slightly larger then the blocks 75, to allow the blocks 75 to flow through. It is to be noted that the shape of the orifices 718 needs not match the shape of the blocks 75 in order for the dispensing device 700 to work. For example, when the shape of the orifices 718 is circular, most blocks 75 having any shape will be able to be dispensed therethrough. It is preferred that the shape and size of the orifices 718 be optimized for the sizes and shapes of the blocks 75 to be dispensed from the orifices 718.

FIG. 7B illustrates that in one example, the orifices 718 are designed such that the blocks 75 flow through each orifice 718 in a single-file manner. The presence of the plurality of the orifices 718 is helpful for controlling of the density of the slurry being dispensed. The number of the orifices 718 varies depending on the number of recessed regions on the substrate 726 that receive the blocks 75. In yet another example, the plurality of orifices 718 has a pattern matching the pattern of the receptor sites on the substrate 726 to easily facility the blocks 75 directly to the receptor sites. Additionally, each of the plurality of the orifices 718 may be configured to have a funnel-like shape which helps aligning and directing the blocks 75 through the orifice 718.

FIGS. 7A and 7C illustrate that in another example, the dispensing device 700 includes a rotation mechanism 712 coupling to each side of the dispensing tube 708. The rotation mechanism 712 rotates the dispensing tube 708 such that when the blocks 75 are to be dispensed onto the substrate 726, the orifices 718 will point directly at the substrate 726. In this event, the orifices 718 face downward and directly above the substrate 726. When the blocks 75 are not to be dispensed, the rotation mechanism 712 rotates the dispensing tube 708 such that the orifices 718 face in a direction away from the substrate 726. The blocks 75 will not be able to dispense onto the substrate 726 when the orifices are not directly above the substrate 726. In one example, the rotation mechanism 712 rotates the dispensing tube from 0-degree to 70-degress acting as an "ON/OFF" switch for the dispensing of the blocks 75 through the plurality of orifices 718. For example, as illustrates in FIG. 7C, the dispensing tube 708 is rotated from one position to another position in the direction of the arrow "A." Thus, from a 0-degree position to a 70-degrees position, the orifices 718 will point directly at the substrate 726 below allowing the dispensing of the blocks 75. Switching on and off the dispensing of the block 75 by rotating the dispensing tube 708 prevents physical damages to the blocks 75 typically seen in conventional methods of turning on or off the dispensing process (e.g., by using valves). Further, rotating the dispensing tube 708 ensures that the blocks 75 are dispensed accurately.

It is envisioned that the dispensing tube 708 may have several lines of orifices placed around the dispensing tube 708. Each of the lines of orifices includes the plurality of orifices 718 located longitudinally along the line. Having several lines of orifices may be useful to speed up the deposition process.

Figure 7A:
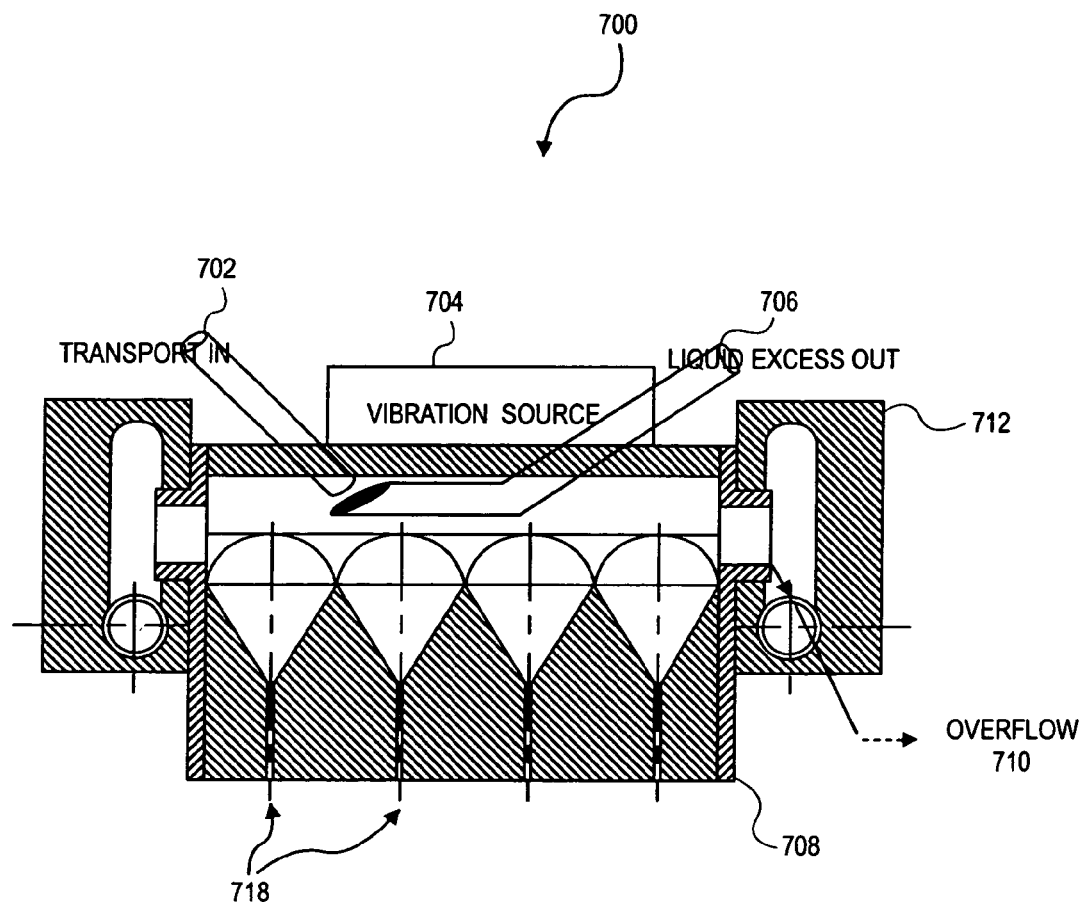
FIGS. 7A–7D illustrate exemplary designs of a dispensing tube used to dispense blocks on a substrate according to some embodiments of the present invention.
Figure 7B:
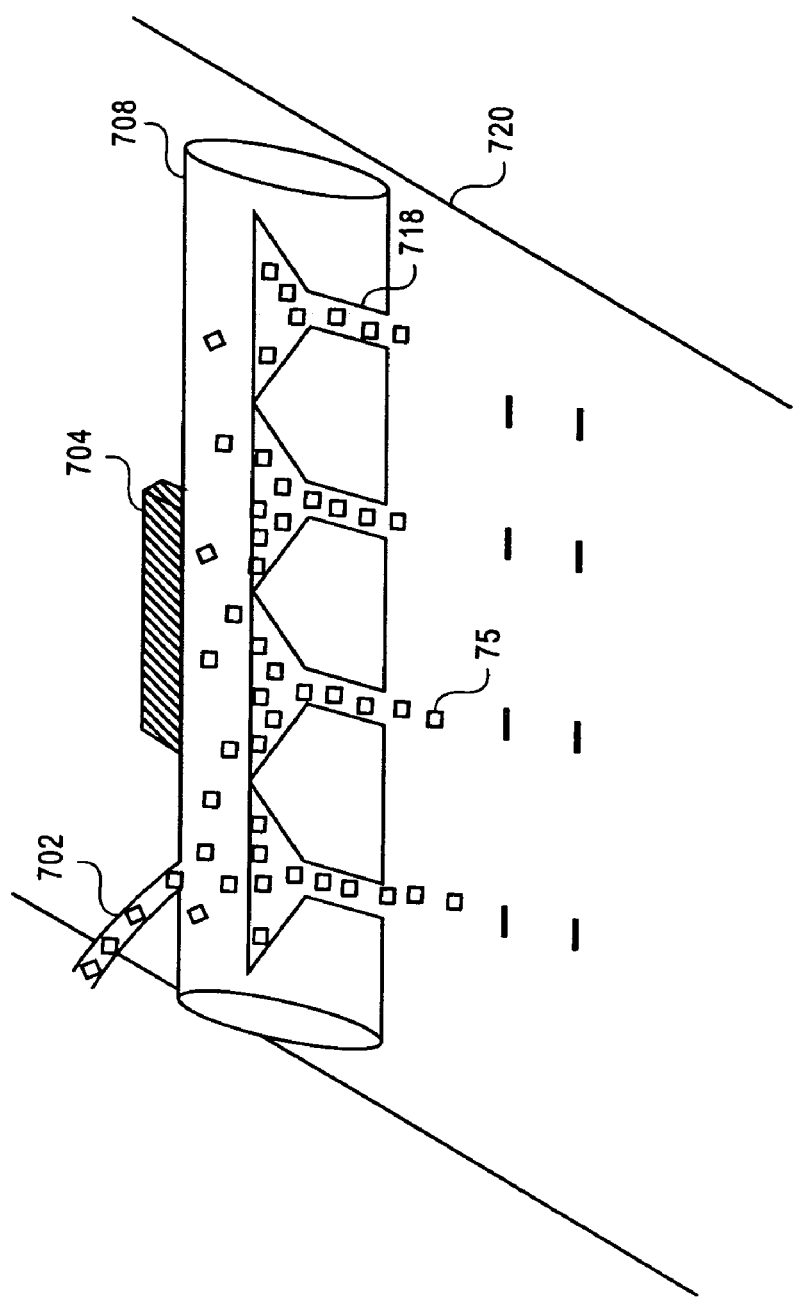
Figure 7C:
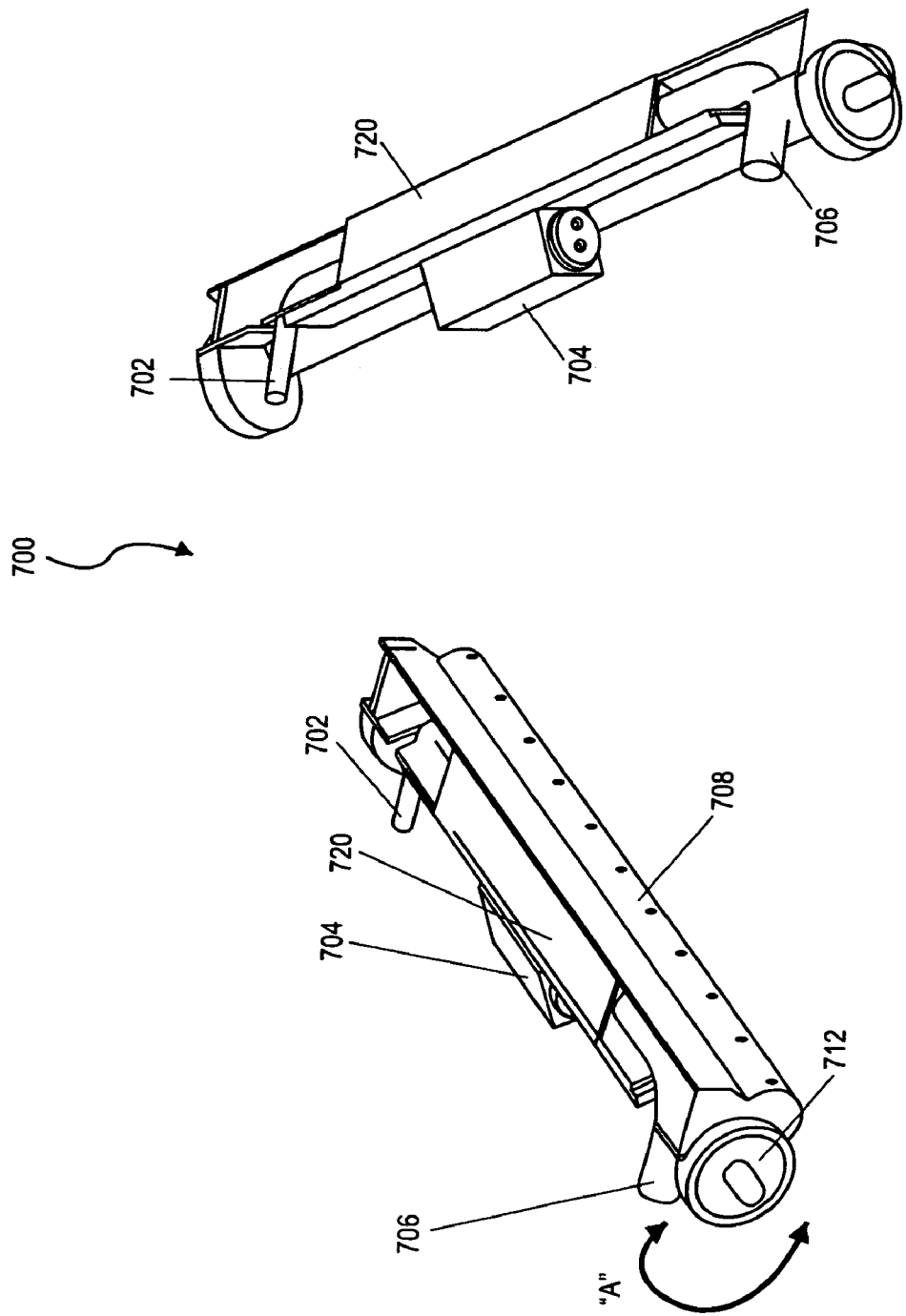
Figure 7D:
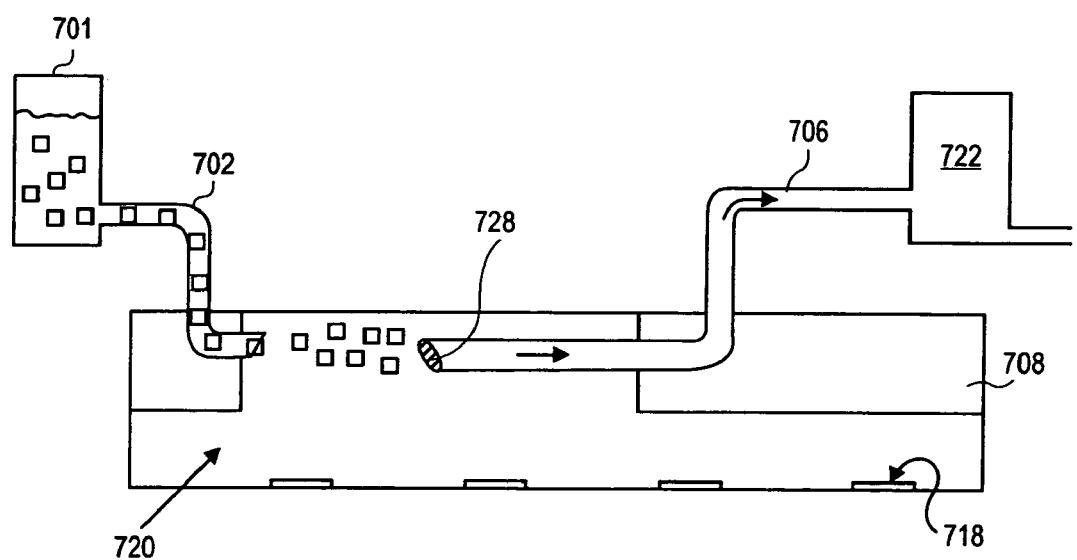

FIG. 7D illustrates an exemplary embodiment of a transfer chamber 720 comprised within the dispensing tube 708. In this embodiment, the slurry (fluid containing the blocks 75) is pumped through the inlet tube 702 from a slurry container 701 and is disposed to the inside and at one end of the transfer chamber 720. The fluid or any excess fluid is removed from the transfer chamber 720 through the outlet tube 706 extended from the other end of the dispensing tube 708 using a vacuum pump 722 coupling to the outlet tube 706. Furthermore, removing the fluid from the transfer chamber 720 helps maintaining a smooth and constant flow inside the transfer chamber 720. Such smooth and constant flow prevents disruption to the blocks 75 allowing the blocks 75 to be distributed over the orifices 718. In one example, a filter 728 is attached to one end of the outlet tube 706 (the end that is inside of the transfer chamber 720). The filter prevents the blocks 75 from being sucked out of the transfer chamber when the vacuum pump 722 is tuned on; the blocks 75 are thus retained on the surface of the filter. Turning off the inlet and the vacuum allows the blocks 75 to fall inside of the transfer chamber 720 where under the effect of the vibration, be distributed longitudinally along the dispensing tube 708. When the dispensing tube 708 is rotated such that the plurality of orifices 718 are pointing downward directly atop the substrate, the blocks 75 are dispensed from these orifices. Note that vibration is maintained throughout.

The diameters and shapes of the plurality of the orifices 718, the vibration level applied by the vibration source 704, the rotation of the dispensing tube 708, and time are among the factors that control the rate of depositing the blocks 75 onto the substrate. Any variation of the above parameters may be done to optimize deposition rate.

Figure 8:
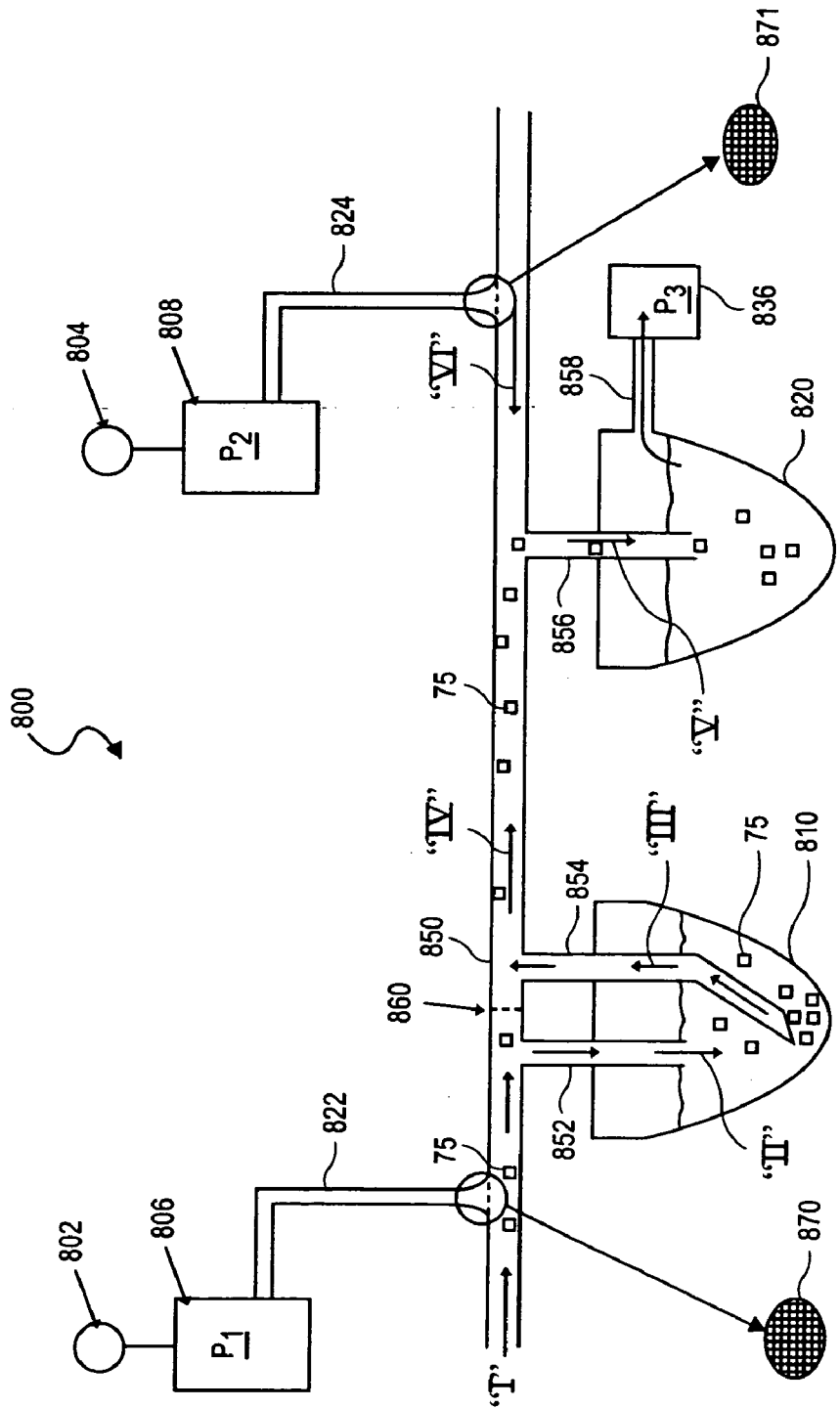
FIG. 8 illustrates a schematic diagram of blocks being moved to a particular process chamber without the use of valves in accordance with one embodiment of the invention.

FIG. 8 illustrates a schematic cross-sectional view of blocks being moved from one process chamber to another process chamber in accordance with one embodiment of the invention. An apparatus 800 is used to transport the blocks 75 in a fluid from one point to another without the need of fluid mechanical components such as valves. Valves are typically used in a system such as a recirculating system that can control the flow of the fluid. One application of such a recirculating system is to prevent back streaming of the blocks 75 in a dispensing system such as the dispensing system 135 discussed above. The valves in such recirculating system open or shut in order to control the flow of the fluid. This shutting and opening of the valves often can cause damages to small elements such as the blocks 75. The valves can crush the blocks leaving debris in the system, and causing undesirable contamination for a dispensing system.

The apparatus 800 includes at least one process chamber. As shown in FIG. 8, the apparatus 800 includes process chamber 810 and 820. The number of the process chambers can be varied to include more or fewer chambers depending on the desired application. The process chambers 810 and 820 can be a recycling station, a recovery station, a cleaning station, or a dispensing station. The process chambers 810 and 820 are further coupled to a transferring line 850, which connects the mini process chambers 810 and 820 to pressure line 822 and pressure line 824, respectively, as shown in FIG. 8. The pressure line 822 extends from a pressure vessel 806 and the pressure line 824 extends from a pressure vessel 808. The pressure vessel 806 includes a pressure regulator 802, which controls the amount of pressure ($P_1$) released from the pressure line 822. Similarly, the pressure vessel 808 includes a pressure regulator 804, which controls the amount of pressure ($P_2$) released from the pressure line 824.

In the embodiment shown in FIG. 8, the blocks 75 are moved into a process chamber system from one process chamber to another process chamber by selectively changing the flow and pressure applied to the fluid having the blocks 75 (the slurry). In one example, the blocks 75 are transported from the process chamber 810 to process chamber 820. The process chamber 810 can be a recycling station whereas the process chamber 820 can be a dispensing station.

In the embodiment shown in FIG. 8, mechanical devices such as valves are not used to control the flow of the slurry. Instead, the slurry flow is varied by an external pumps (not shown) or suction source that control the pressure $P_1$ and $P_2$. The pumps increase or decrease the flow of the slurry thereby transporting the blocks 75 from one process chamber to the next. The pump, or suction source, pulls slurry out of the chamber, causing a pressure drop. The slurry is carried along with the fluid. By transporting the blocks 75 without the use of valves, techniques of the invention are able to avoid damage that may be caused to the blocks as the blocks move through valves.

One exemplary scheme of transporting of the blocks 75 is referred to as a pressure regulating mechanism. The varying of the pressure that the slurry sees in each chamber regulates the transporting of the blocks 75 from one process chamber to the next. The slurry would move to the chamber at lower pressure. In one example, the slurry comprising the blocks 75 is flown along in the transferring line 850 in the direction of arrow "I." The pressure $P_1$ coming from the pressure line 822 is high (e.g., 5–10 psi). The pressure P2 coming from the pressure line 824 is about the same or less than the pressure $P_1$ coming from the pressure line 822 (e.g., 3–8 psi). The blocks 75 are pushed into the process chamber 810 through tube 852 in the direction of arrow "II" and continue to move along the direction of the arrow "III" out of the processing chamber 810.

In another example, the transferring line 850 includes a screen 860 placed along the transferring line 850 behind the tube 852. Examples of a screen 886 include a mesh or a sieve, preferably made of a plastic material, having size sufficient to stop the blocks 75 from passing through. With the screen 852 in place, the block 75 are pushed into the process chamber 810 as opposed to moving along the transferring line 850 and bypassing the process chamber 810. With the high pressure continued, the blocks 75 continue to move with the slurry in the direction of arrow "V" into another portion of the transferring line 850. The blocks 75 continue to move with the slurry in the direction of arrow "IV" and be pushed into the process chamber 820 in the direction of arrow "V." The lower pressure $P_2$ coming from the pressure line 824 in the direction of arrow "VI" prevents the blocks 75 from continuing along the transferring line 850 pass the process chamber 820. The blocks 75 are thus dispensed into the process chamber 820 through tube 856.

In the example where the process chamber 820 is a dispensing device, the blocks 75 can be dispensed over a substrate according to some of the embodiments discussed above. The process chamber 820 may include an outlet tube 858 for releasing excess fluid from the process chamber 820. A pump 836 may be used to direct the excess fluid from the process chamber 820. In this example, the pump 836 may generate a pressure $P_3$ that is less than $P_1$ (e.g., less than 5 psi) to prevent back flow from the process chamber 820.

In yet another embodiment, the pressure line 822 includes a screen 870 to prevent the blocks 75 from entering the pressure line 822. Similarly, the pressure line 824 also includes a screen 871 to prevent the blocks 75 from entering the pressure line 824. Examples of a screen 870 or 871 include a mesh or a sieve having size sufficient to stop the blocks 75 from passing through.

By moving the blocks 75 between mini process chambers, the blocks 75 may be cleaned, treated, or recycled independently of each mini process chamber. The cleaning process typically would involve recirculation of the devices in deionized water, organic solvent such as acetone or isopropanol, or FSA solution. The recirculation stream is filtered to remove any undesirable particulate matter. The treatment process is typically any number of types of surface oxidation or surface chemistry. For example, the blocks 75 may be filtered from the slurry, passed into a station for rinsing with pure water, and dispensed into another batch of fluid used to make a slurry or the same slurry.

Figure 9:
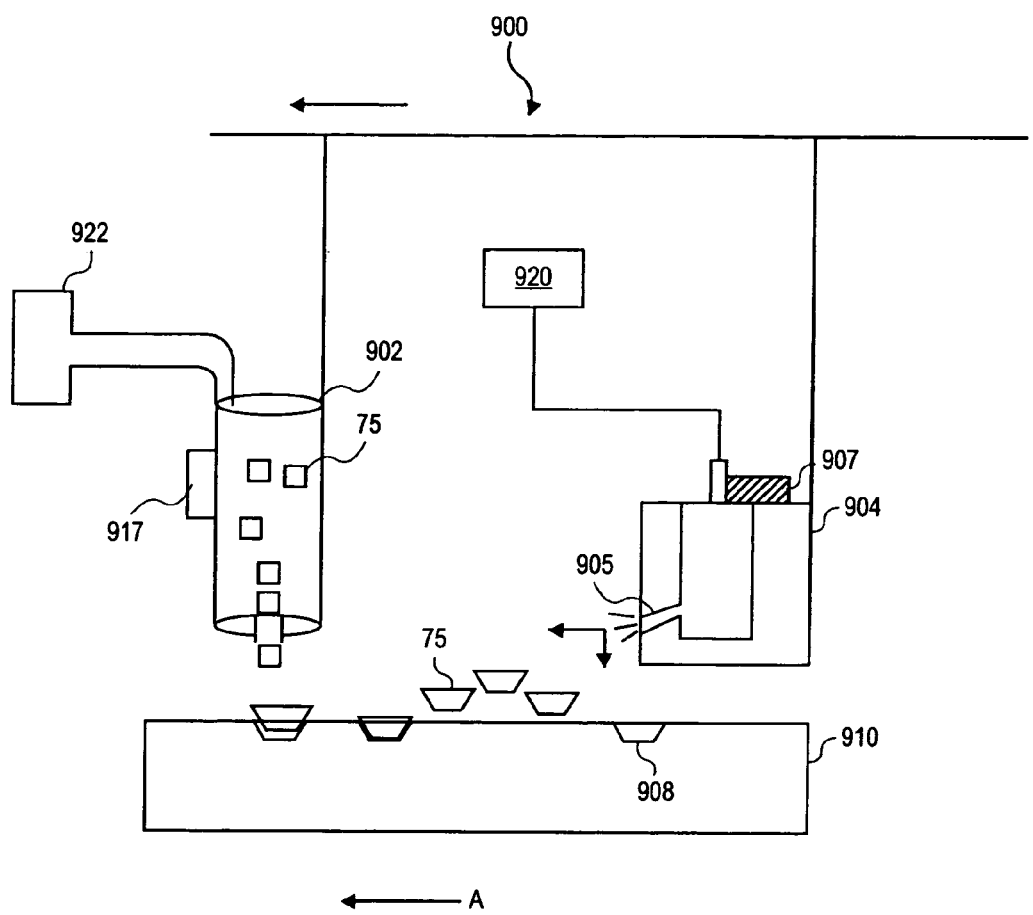
FIG. 9 illustrates a schematic diagram of an apparatus which can jet out fluid over a substrate used in conjunction with any of the dispensing devices of the present invention to removes excess blocks from the substrate.

FIG. 9 illustrates an exemplary apparatus 900 made in accordance with the present invention to move the blocks 75 over recessed regions 908 in a substrate 910 and to clear excess blocks 75 from the substrate 910. The apparatus 900 includes a dispensing device 902 positioned in front of a clearing device 904 such that when the apparatus 900 progresses in a direction "A" over a web line of the substrate 910, the dispensing device 902 moves ahead of the clearing device 904.

The dispensing device 902 can be any of the dispensing devices described above (e.g., dispensing device 100, 135, and 700) which is used to dispense the blocks 75. In the example shown in FIG. 9, the dispensing device 902 is coupled to a slurry container 922 which dispenses the slurry into the dispensing device 902. The dispensing device 902 is further coupled to a vibration device 917 which vibrates or agitates the slurry as the slurry is being dispensed over the substrate 910.

The clearing device 904 is essentially a container storing a fluid used to clear the excess blocks 75 off the substrate 910. The clearing device 904 further has at least one nozzle 905 for the fluid to flow therethrough. The clearing device 904 is configured such that it can jet out the fluid at a variable rate allowing the dispensing device 904 to move excess the blocks 75. In one example, the fluid flow is set at a rate such that the fluid flow is able to clear the excess blocks 75 off the substrate 910.

In one example, the clearing device 904 is positioned near substrate 910 in order to more easily direct the stream of the fluid at the nozzle 905. The clearing device 904 may also be coupled to a compression device or a pulsating device 907 which can pulsate the slurry. As the pulsation device 907 applies pulsation to the fluid, the flow rate of the fluid and the pressure applied to the fluid rapidly change within the local area between the fluid flow and the substrate 910. The pulsation from the pulsating device 907 causes the fluid flow to change rapidly.

In another example, the dispensing device 904 is coupled to a motor device that can pulsate or agitate the fluid in the clearing device 904. In this example, the motor device takes place of the pulsating device 907. The pulsation created by the motor device also causes rapid change (but small) in the pressure that affects the flow of the fluid. This rapid change in pressure breaks the static friction between the surface of substrate 910 and the blocks 75. This allows the blocks 75 to move freely generally following the direction of the flow of the fluid along the nozzle 905. With the blocks 75 flowing in the direction of the fluid flow because of the pulsation applied to the dispensing device 900, the blocks 75 may be cleared or removed from an area over substrate 910.

In another embodiment of the invention, the clearing device 904 can alternately jets out the fluid and takes in the fluid creating a net flow rate of approximately zero. The fluid moves back and forth, without a net positive flow of fluid coming out of the clearing device 904. Having the clearing device 904 jetting in and out the fluid creating rapid change in the static friction between the surface of the substrate 910 and the blocks 75, it is much more easy to control the clearing and removal of excess blocks of an area over the substrate 910. In contrast, in conventional systems, it is difficult to control clearing or the removal of excess the blocks 75 because laminar flow of fluid such as deionized water is typically used. Generally, it takes a much greater amount of flow than laminar flow to break the temporary bond that exists between the blocks 75 and the substrate 910.

Figure 10:
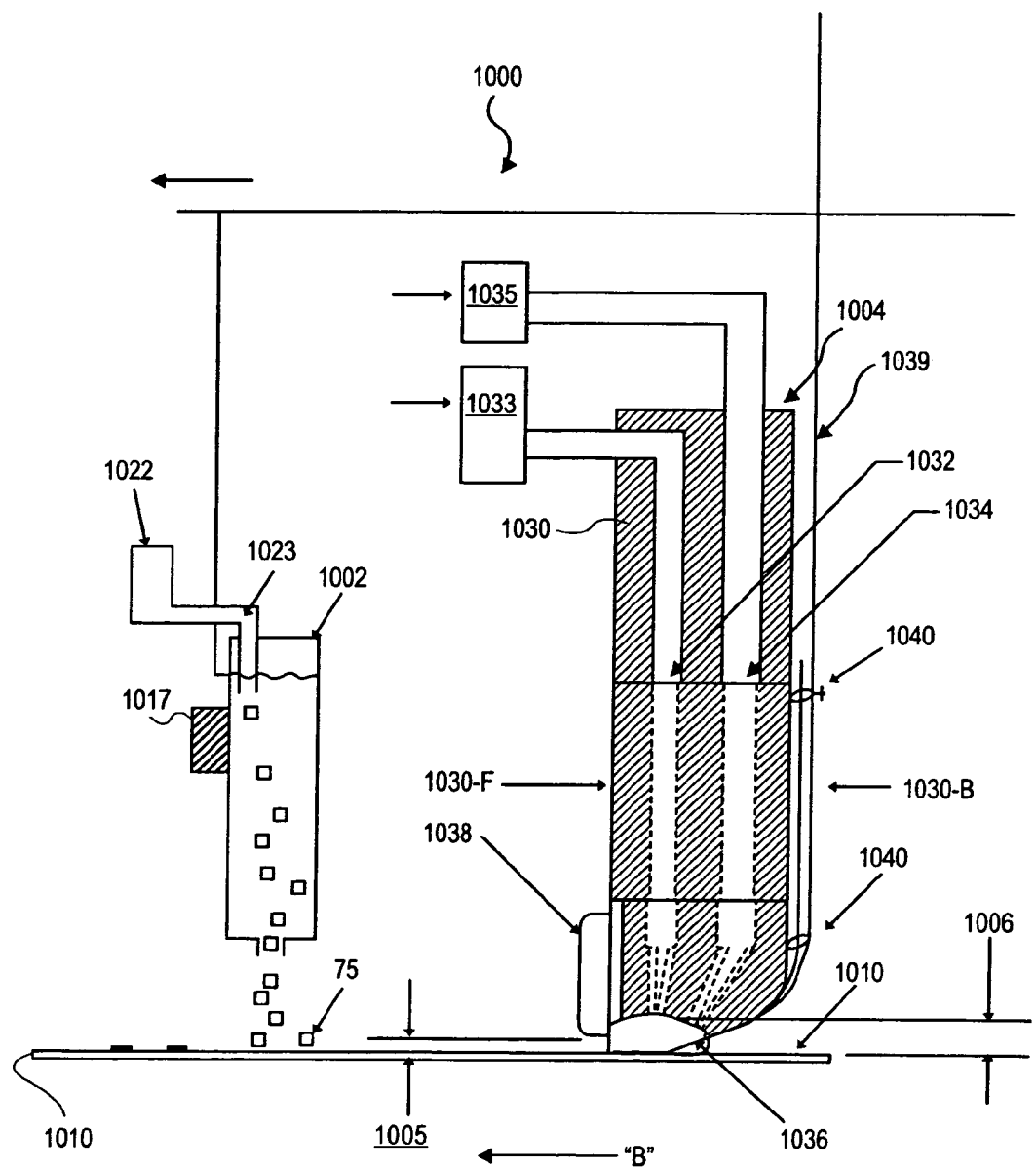
FIG. 10 illustrates an exemplary device using vacuum to pick up at least one block of a plurality of blocks into a blocks clearing device to remove excess blocks from the substrate.

FIG. 10 illustrates an exemplary apparatus 1000 made in accordance with the present invention to move the blocks 75 over a substrate 1002 and to clear excess blocks 75 from the substrate 1002. The apparatus 1000 includes a dispensing device 1002 positioned in front of a clearing device 1004 such that when the apparatus 1000 progresses in a direction "B" over a web line of the substrate 1010, the dispensing device 1002 moves ahead of the clearing device 1004.

The dispensing device 1002 of FIG. 10 can be any of the dispensing devices described above (e.g., dispensing devices 100, 135, and 700) which is used to dispense the blocks 75. In the example shown in FIG. 10, the dispensing device 1002 is coupled to a slurry container 1022 which dispenses the slurry into the dispensing device 1002 through a tube 1023. The dispensing device 1002 is further coupled to a vibration device 1017 which vibrates or agitates the slurry as the slurry is being dispensed over the substrate 1010.

The clearing device 1004 of FIG. 10 includes a nozzle head 1030 having vacuum channel(s) at one or two vacuum levels. In the case when only one vacuum level is used, the same vacuum is applied across the nozzle head. FIG. 10 shows the case when there is a low vacuum channel 1032 and a high vacuum channel 1034. The low vacuum channel 1032 is coupled to a low vacuum pump 1033 and the high vacuum channel 1034 is coupled to a high vacuum pump 1035. Each of the vacuum pump can be a liquid suction device able. And, in another example, both the low vacuum channel 1032 and the high vacuum channel 1034 may be coupled to one single vacuum pump or one single liquid suction device having two different fittings adapted for each of the low vacuum channel 1032 and the high vacuum channel 1234. In another example, each of the vacuum pump 1033 and 1035 includes a filter (not shown) to prevent the excess blocks 75 that are removed from the substrate 1010 from entering the pump.

Each of the vacuum channel 1032 and 1034 terminates into at least one small orifice at the tip of the nozzle head 1030. The clearing device 1004 further couples to a fixture 1039 which is able to move the clearing device 1004 across the web line of the substrate 1010.

In operation, the clearing device 1004 moves behinds the dispensing device 1002. As vacuum is applied to each of the low vacuum channel 1032 and the high vacuum channel 1034, the excess blocks 75 (those not deposited into receptor sites on the substrate 1010) are sucked into the nozzle head 1030 into either the low vacuum channel 1032 or the high vacuum channel 1034. A variety of vacuum level gradients may be used in a controllable fashion to apply different suction forces over substrate 1010 to remove or recover the blocks 75.

For example, the low vacuum channel 1032 may use a pressure ranging from 0.50 psi to 0.80 psi above the substrate 1010 to provide enough force to remove excess the blocks 75 that are not deposited in the recessed regions. The low vacuum pressure will not disturb or remove the blocks 75 that are placed in recessed regions. The low vacuum pressure may just slightly lift the excess blocks 75 off the substrate. Additionally, the high vacuum channel 1034 may use a pressure ranging from 0.01 psi to 0.5 psi to apply a stronger force to remove the excess blocks 75. For instance, when the low vacuum channel 1032 applies just enough force to lift the excess blocks 75 off the substrate 1010, the high vacuum channel 1034 followed immediately and applies a stronger force to completely remove the excess blocks 75 off the substrate 1010. In another example, the low vacuum pressure generates a force such that the slurry above the substrate 1010 has a flow rate ranging from about 0.2 L/min to 0.7 L/min. And, the high vacuum pressure generates a force such that the slurry above the substrate 1010 has a flow rate ranging from about 1 L/min to 3 L/min. Both the high and low vacuum channels may send the recovered blocks 75 to a temporary storage area such as a container (not shown) where the blocks 75 may be cleaned and redispensed. Alternatively, the high and low vacuum channels may also send the blocks 75 back to the dispensing tube 1002 to recycle the blocks 75 such that they may be re-dispensed.

In another example, a flexible scraper 1036 is slidably coupled to the nozzle head 1030 of FIG. 10. The flexible scraper 1036 is also attached to the fixture 1039 through a couple of clamps 1040. The flexible scraper 1036 can slide back and forth along the fixture 1039. The flexible scraper 1036 can be made out of plastic or Mylar. In this example, the flexible scraper 1036 protrudes from the fixture 1039 and the top portion of the flexible scraper 1036 is in immediate contact with the substrate 1010. When the flexible scraper 1036 rests on top of the substrate 1010 as shown in FIG. 10, the scraper 1036 prevents any fluid from the back side 1030-B of the nozzle 1030 from being drawn into the nozzle 1030. Thus, as the clearing device 1004 follows behind the dispensing device 1002, the blocks 75 will flow in the direction of the vacuum from the font side 1030-F of the nozzle 1030 and be sucked into the nozzle 1030 with no interference from any fluid flow from the back side 1030-B of the nozzle 1030.

In yet another example, the clearing device 1004 of FIG. 10 includes an adjustment plate 1038 slidably coupled to the front side 1030-F of the nozzle 1030. The adjustment plate 1038 controls the amount of a clearing distance 1005 for the nozzle 1030. The clearing distance 1005 dictates the amount of surface area being exposed to the nozzle 1030. The clearing distance in turn controls the fluid velocity entering the clearing device near the substrate, which affects the ability of the fluid to force blocks into the vacuum nozzles of the clearing device.

Figure 11:
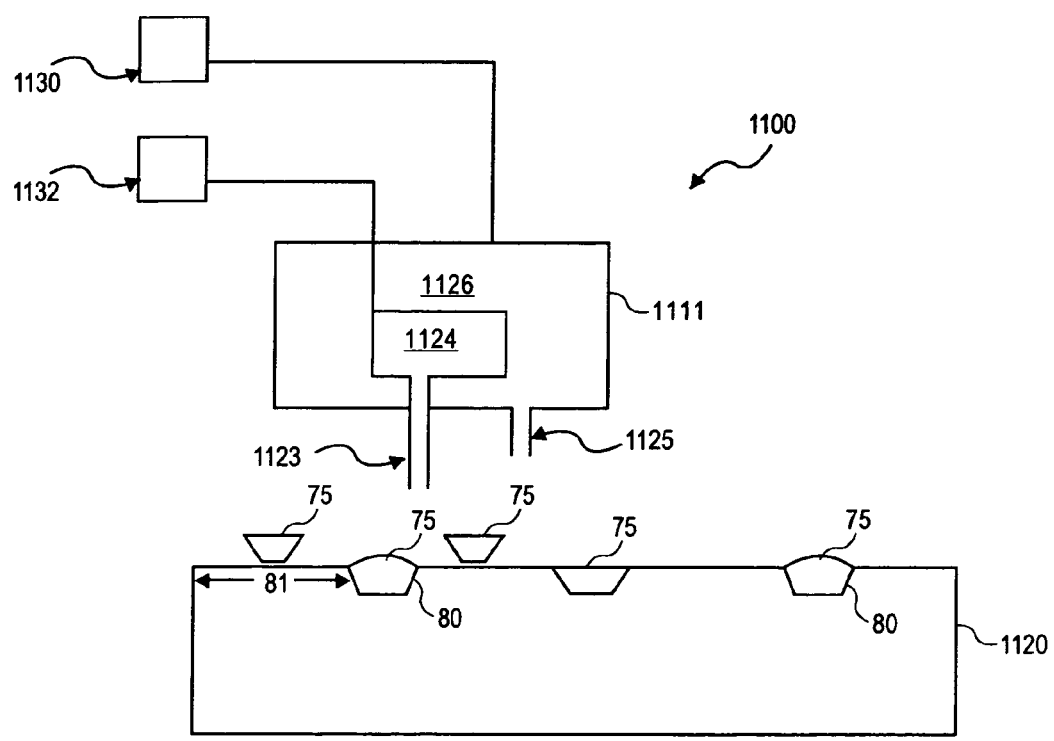
FIG. 11 illustrates a block diagram of an exemplary device using vacuum to pick up at least one block of a plurality of blocks into a blocks clearing device to remove excess blocks from the substrate.

FIG. 11 illustrates a schematic cross-sectional view of yet another clearing device 1100 which uses vacuum to clear blocks 75 off a substrate 1120. The clearing device 1100 may be used in conjunction with a dispensing device such as dispensing devices 100, 135, and 700 discussed above. The clearing device 1100 is similar to the clearing device 1004 of FIG. 10. The clearing device 1100 includes a head 1111 which can move over recessed regions 80 in the substrate 1120 in order to vacuum the blocks 75 off the substrate. The head 1111 has a nozzle 1123 and a nozzle 1215 that use a vacuum to remove excess the blocks 75 above and around where the recessed regions that are filled with blocks 75. In one example, the nozzle 1123 extends from a low vacuum housing 1124 and the nozzle 1125 extends from a high vacuum housing 1126. The low vacuum housing 1124 can be compared to the low vacuum pressure channel 1032 of FIG. 10 and is further coupled to a low vacuum pump 1132. The high vacuum housing 1126 can be compared to the high vacuum pressure channel 1034 of FIG. 10 and is coupled to a high vacuum pump 1130. In this example, a variety of vacuum level gradients may be used in a controllable fashion to apply different suction forces over the substrate 1120 to remove or recover the excess blocks 75.

FIG. 11 illustrates that two different vacuum pumps are used, one to generate the low vacuum pressure and the other to generate the high vacuum pressure. Alternatively, only one vacuum pump with two different fittings may be used to generate both the high vacuum pressure and the low vacuum pressure.

For example, the nozzle 1123 may use a low vacuum pressure (e.g., 0.50 psi to 0.80 psi) above recessed regions 80 to provide enough force to remove the excess blocks 75 nearby the recessed regions 80. The removal of the excess blocks 75 with the low vacuum may occur without disturbing or removing the blocks 75 that are already placed in recessed regions 80. A high vacuum (e.g., 0.01 psi to 0.50 psi) is applied to the nozzle 1125 to provide a stronger force to remove excess the blocks 75 between the recessed regions 80 on the substrate 1120 (e.g., regions 81 of FIG. 11). In this manner, the nozzle 1125 using the high vacuum may collect excess the blocks 75 and place excess the blocks 75 in separate containers (not shown). Both the high and low vacuum used by the nozzles 1123 and 1125 send the recovered the blocks 75 to a temporary storage area such as a container (not shown) where the blocks 75 may be cleaned and redispensed. Alternatively, the high and low vacuum housings may also send the blocks 75 back to the dispensing tube 1002 to recycle the blocks 75 such that they may be re-dispensed.

Figure 12:
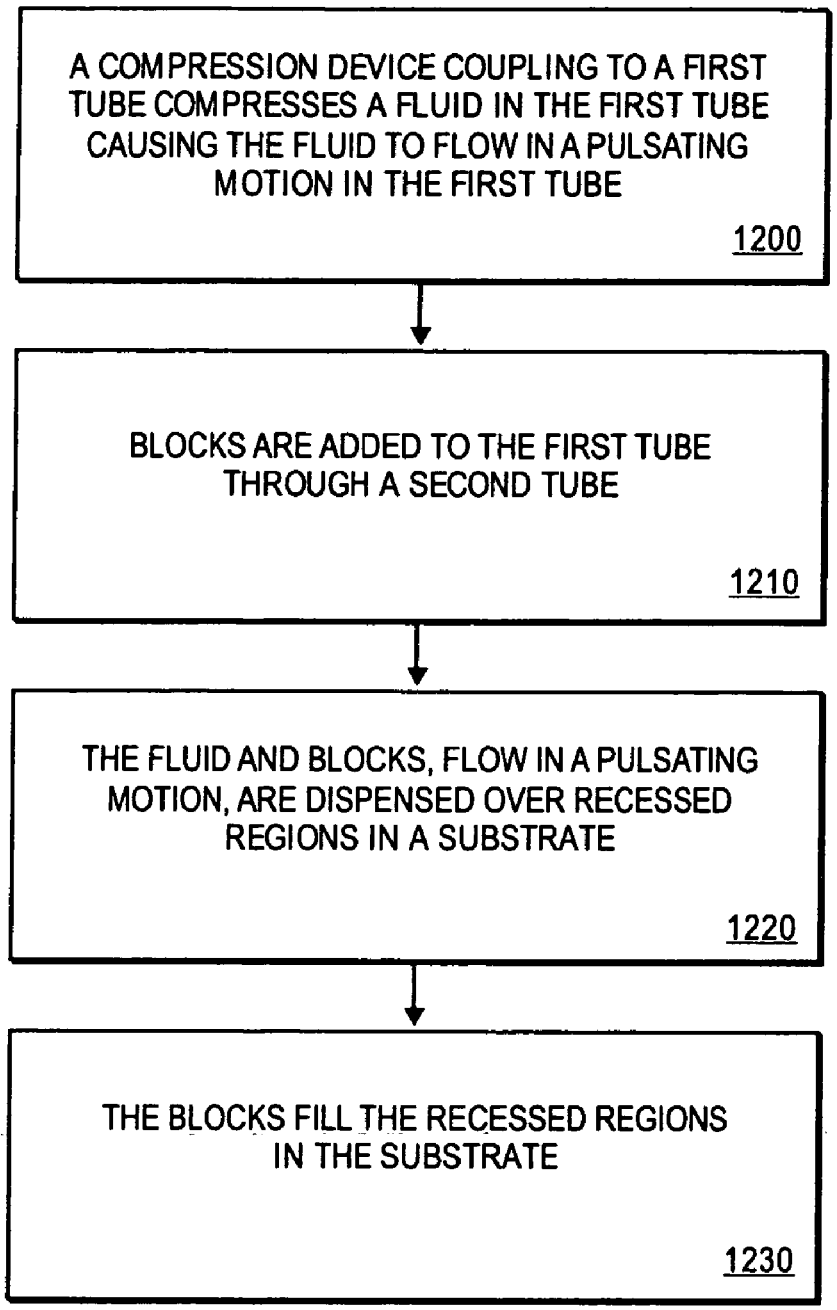
FIGS. 12 to 15 illustrate exemplary methods of depositing blocks onto a substrate using apparatuses of the present invention.

FIGS. 12 through 15 describe methods of moving blocks in accordance with techniques of the inventions. FIG. 12 illustrates a block diagram of an exemplary method in which the blocks in a fluid are moved with assistance of vibration source to pulse through a tube in accordance with one embodiment of the invention. At block 1200, a compression device compresses a fluid in a first tube, causing the fluid to flow in a pulsating motion in the first tube. The compression device is coupled to the first tube. At the block 1210, blocks are added to the first tube through a second tube. At block 1220, the fluid and blocks, flow in a pulsated motion, are dispensed over receptor sites (or recessed regions) in a substrate. At block 1230, the blocks fill the receptor sites in the substrate.

Figure 13:
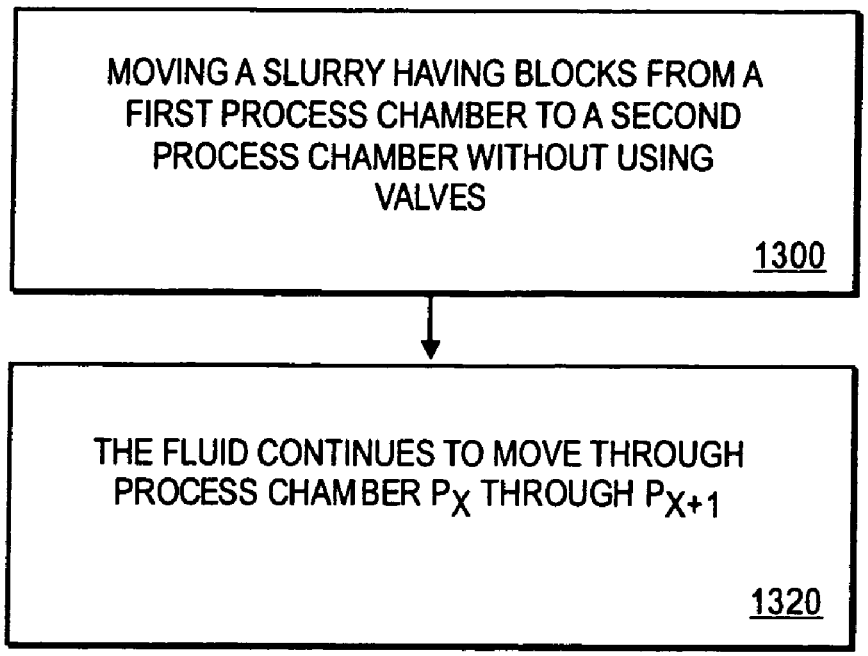

FIG. 13 illustrates a block diagram of an exemplary method of moving a plurality of blocks moving from a first process chamber to a second process chamber in accordance with one embodiment of the invention. At block 1300, the blocks enter a first process chamber through a first tube. In the first process chamber, the blocks are cleaned. Cleaning blocks may involve for example, placing the slurry in a container, rinsing the blocks with DI water or FSA™ solution in a filtered, recirculating flow, and then transporting the blocks to a chamber containing FSA fluid. The blocks are then moved to a second process chamber where the blocks are treated. The treatment is typically a surface oxidation, but it could be any surface chemistry modification of the blocks. At block 1320, the fluid continues to move through process chambers $P_x$ through $P_{x+1}$. It will be appreciated that the flow of the fluid that the process chamber $P_x$ and $P_{x+1}$ see is controlled by a pressure regulating mechanism. In static conditions, $P_x$ and $P_{x+1}$ are at the same pressure. To transfer blocks from $P_x$ to $P_{x+1}$, the pressure in $P_{x+1}$ is lowered with respect to $P_x$. It will be appreciated by one skilled in the art that no valves are necessary to move the blocks. This is advantageous given that valves may harm blocks.

Figure 14:
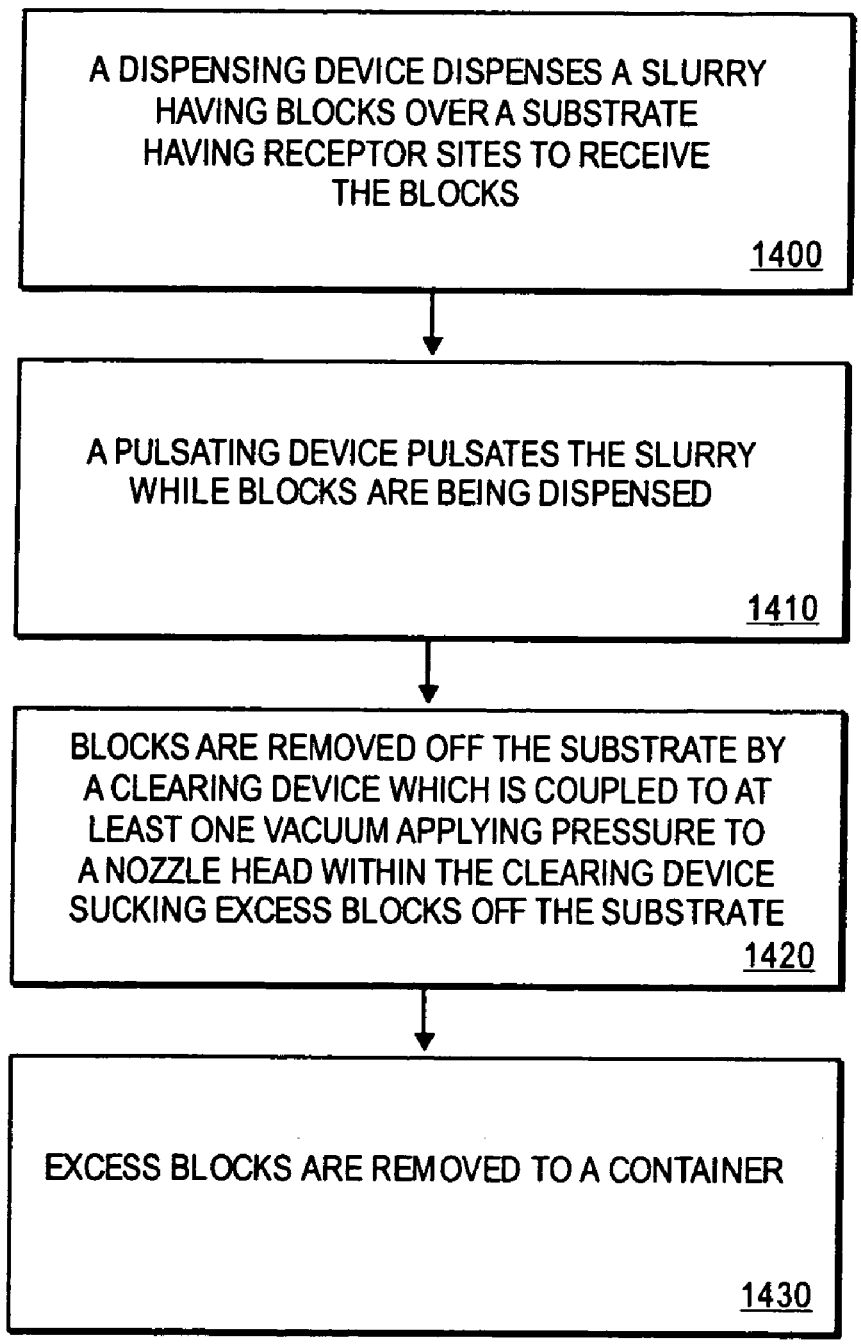

FIG. 14 illustrates an exemplary method of dispensing blocks and clearing excess blocks the exemplary embodiments discussed above. At block 1400, a dispensing device dispenses a slurry having blocks over a substrate having receptor sites to receive the blocks in accordance with one embodiment of the invention. At block 1410, a pulsating device pulsates the slurry while the blocks are being dispensed.

At block 1420, blocks are removed off the substrate by a clearing device which is coupled to at least one vacuum applying pressure to a nozzle head within the clearing device sucking excess blocks off the substrate. In one example, the vacuum is activated causing at least one block of the plurality of blocks to enter the nozzle head of the clearing device. It will be appreciated that a variety of gradients in the vacuum may be used. For example, a high vacuum ranging from 0.01 psi to 0.50 psi may be used to remove excess blocks between the recessed regions. Alternatively, a low vacuum ranging from 0.50 psi to 0.80 psi may be used when the block clearing device is above recessed regions to provide sufficient force to remove excess blocks near the recessed regions but without disturbing or removing the blocks that are already assembled in recessed regions. In one example, the nozzle head comprises a low vacuum channel and a high vacuum channel. A low vacuum pressure (e.g., pressure ranging from 0.50 psi to 0.80 psi) is applied to the low vacuum channel to lift the excess blocks off the substrate. A high vacuum pressure (e.g., pressure ranging from 0.01 psi to 0.50 psi) is applied to the high vacuum channel to completely remove the excess blocks off the substrate into the clearing device.

At block 1430, the recovered blocks are placed into a container for storage. Subsequently, the blocks may then be cleaned and then redispensed using the techniques described herein.

Figure 15:
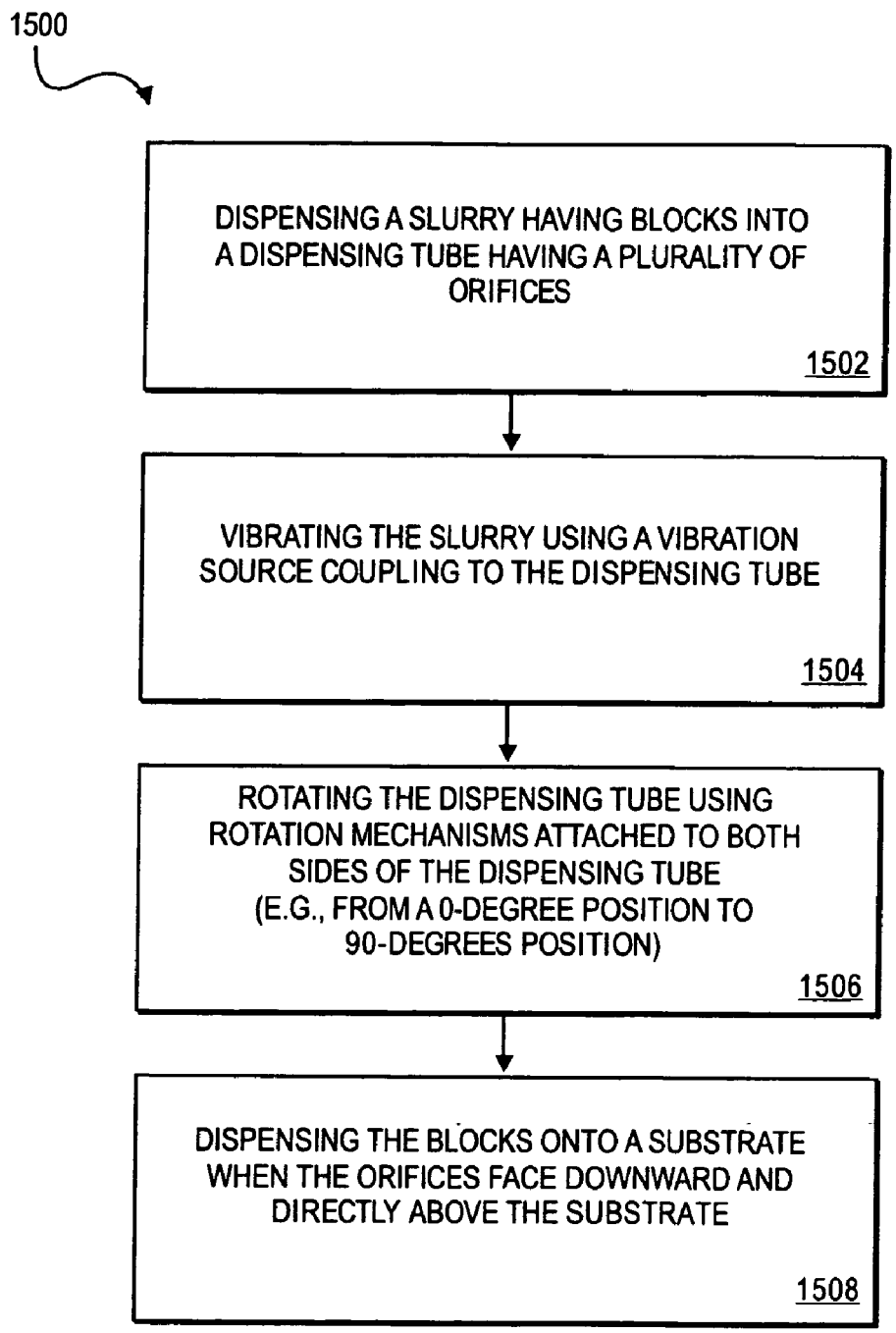

FIG. 15 describes an exemplary method of moving blocks in accordance with techniques of the inventions, method 1500. At block 1502, a slurry having a plurality of blocks are dispensed into a dispensing tube which has a plurality of orifices. In one example, the dispensing tube includes an inlet tube, and it is through the inlet tube that the slurry is dispensed into the dispensing tube. At bock 1504, the dispensing tube is vibrated using a vibration source coupling to the dispensing tube. In one example, the vibration source produces frequencies ranging from 2 Hz to 2000 Hz. In another example, the vibration source vibrates the slurry at a frequency ranging from 2 Hz to 2000 Hz. At block 1505, the dispensing tube is rotated using a rotation mechanism coupling to each side of the dispensing tube. The rotation turns ON or OFF the dispensing of the plurality of the blocks. For example, when the dispensing tube is rotated from a 0-degree position to a 90-degrees position, the plurality of orifices faces downward and directly above a substrate. In this 90-degree position, the plurality of blocks is dispensed from the orifices onto the substrate. In one example, the substrate includes a plurality of receptor sites or recessed regions configured to receive the plurality of blocks. In the 0-degree position, the orifices face away or point away from the substrate; this is referred to as the OFF position. Having the orifices not directly above the substrate, the blocks are not dispensed out of the orifices. At box 1508, the plurality of blocks is dispensed from the dispensing tube.

In an alternative method, the dispensing tube includes a filter coupling to an outlet tube through which excess fluid is removed from the transfer chamber. In this method, the outlet tube is coupled to a pump which is turned on as the slurry is being dispensed into the transfer chamber. The fluid is sucked out of the transfer chamber while the filter help retaining the plurality of the blocks inside the chamber. To dispense the plurality of blocks, the pump is turned off, the blocks would descend to the bottom of the tube. The vibration source is turned on to even distribute the plurality of blocks longitudinally along the dispensing tube. The plurality of blocks then assembles and falls into the orifice areas and be dispensed outside through the plurality of orifices.

In the preceding detailed description, the invention is described with reference to specific embodiments thereof. It will, however, be evident that various modifications and changes may be made thereto without departing from the broader spirit and scope of the invention as set forth in the claims. The specification and drawings are, accordingly, to be regarded in an illustrative rather than a restrictive sense.

What is claimed is:

1. An apparatus for forming an electric assembly comprising:
   a dispensing tube having a plurality of orifices located longitudinally along a surface of said dispensing tube; and
   a vibration source coupling to said dispensing tube; wherein
   said dispensing tube is configured for a plurality of blocks to be dispensed from said plurality of orifices and onto a substrate and wherein said vibration source facilitates even distribution of said plurality of blocks along said dispensing tube.

2. The apparatus as in claim 1 wherein said vibration source produces frequencies ranging from 2 HZ to 2000 HZ.

3. The apparatus as in claim 1 wherein said plurality of orifices has sizes and shapes configured to match said plurality of blocks.

4. The apparatus as in claim 1 wherein said plurality of orifices has a first pattern matching a second pattern of a plurality of receptor sites on a substrate that is configured to receive said plurality of blocks.

5. The apparatus as in claim 1 further comprising a rotation mechanism coupling to each side of said dispensing tube wherein said rotation mechanism rotates said dispensing tube.

6. The apparatus as in claim 1 further comprises a transfer chamber located inside said dispensing tube wherein a fluid is pumped in and out of said transfer chamber.

7. An apparatus for forming an electric assembly comprising:
   a dispensing tube having a plurality of orifices located longitudinally along a surface of said dispensing tube; and
   a vibration source coupling to said dispensing tube; wherein
   said dispensing tube is configured for a plurality of blocks to be dispensed from said plurality of orifices and wherein said vibration source facilitates even distribution of said plurality of blocks along said dispensing tube;

a transfer chamber located inside said dispensing tube wherein a fluid is pumped in and out of said transfer chamber; and wherein an inlet tube is disposed into a first end of said transfer chamber and an outlet tube is coupled to a second end of said transfer chamber, where a slurry having said plurality of blocks dispensed in said fluid is pumped into said transfer chamber through said inlet tube and excess fluid is poured out of said transfer chamber through said outlet tube.

8. The apparatus as in claim 7 wherein a filter is further coupled to said outlet tube, said filter prevents said plurality of blocks from being removed out of said transfer chamber with said excess fluid.

9. An apparatus for forming an electric assembly comprising:

a dispensing tube having a plurality of orifices located longitudinally along a surface of said dispensing tube; and a vibration source coupling to said dispensing tube; wherein said dispensing tube is configured for a plurality of blocks to be dispensed from said plurality of orifices and wherein said vibration source facilitates even distribution of said plurality of blocks along said dispensing tube;

a rotation mechanism coupling to each side of said dispensing tube wherein said rotation mechanism rotates said dispensing tube;

wherein said rotation mechanism rotates said dispensing tube from a 0-degree position to a 90-degree position.

10. An apparatus for forming an electric assembly comprising:

a dispensing tube having a plurality of orifices located longitudinally along a surface of said dispensing tube; and a vibration source coupling to said dispensing tube; wherein said dispensing tube is configured for a plurality of blocks to be dispensed from said plurality of orifices and wherein said vibration source facilitates even distribution of said plurality of blocks along said dispensing tube;

a rotation mechanism coupling to each side of said dispensing tube wherein said rotation mechanism rotates said dispensing tube;

wherein said rotation mechanism rotates said dispensing tube such that when said plurality of blocks is being dispensed said plurality of orifices passes downward and directly above a substrate.

11. An apparatus for forming an electric assembly comprising:

a dispensing tube having a plurality of orifices located longitudinally along a surface of said dispensing tube; and a vibration source coupling to said dispensing tube; wherein said dispensing tube is configured for a plurality of blocks to be dispensed from said plurality of orifices and wherein said vibration source facilitates even distribution of said plurality of blocks along said dispensing tube;

a rotation mechanism coupling to each side of said dispensing tube wherein said rotation mechanism rotates said dispensing tube;

wherein said rotation mechanism rotates said dispensing tube such that said plurality of orifices points in a direction away from a substrate when said plurality of blocks are not to be dispensed onto said substrate.

12. An apparatus for forming an electric assembly comprising:

a dispensing tube having a plurality of orifices located longitudinally along a surface of said dispensing tube; and a vibration source coupling to said dispensing tube; wherein said dispensing tube is configured for a plurality of blocks to be dispensed from said plurality of orifices and wherein said vibration source facilitates even distribution of said plurality of blocks along said dispensing tube;

wherein said vibration source controls when said plurality of blocks are dispensed onto said substrate.

\* \* \* \* \*